(12) United States Patent
Kenney et al.

(10) Patent No.: US 9,011,623 B2
(45) Date of Patent: Apr. 21, 2015

(54) COMPOSITE ENCLOSURE

(75) Inventors: Kevin M. Kenney, San Jose, CA (US); Peter N. Russell-Clarke, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 834 days.

(21) Appl. No.: 13/039,490

(22) Filed: Mar. 3, 2011

(65) Prior Publication Data
US 2012/0222985 A1 Sep. 6, 2012

(51) Int. Cl.

| | |
|---|---|
| *B29C 70/34* | (2006.01) |
| *B29C 53/56* | (2006.01) |
| *B65H 81/00* | (2006.01) |
| *B29C 70/32* | (2006.01) |
| *H05K 5/00* | (2006.01) |
| *B29C 53/84* | (2006.01) |
| *B29L 31/34* | (2006.01) |

(52) U.S. Cl.
CPC .............. *B29C 70/32* (2013.01); *B29C 53/562* (2013.01); *B29C 53/564* (2013.01); *B29C 53/845* (2013.01); *B29C 70/347* (2013.01); *B29L 2031/3437* (2013.01); *B29L 2031/3481* (2013.01); *H05K 5/0008* (2013.01)

(58) Field of Classification Search
USPC ......... 156/169, 173, 182, 184, 185, 187, 188, 156/190, 191, 242, 245, 153, 189, 193, 194, 156/268; 455/347
See application file for complete search history.

(56) References Cited

U.S. PATENT DOCUMENTS

| | | | |
|---|---|---|---|
| 1,775,813 | A | 9/1930 | Colby |
| 1,957,156 | A | 5/1934 | Barth et al. |
| 2,050,901 | A | 8/1936 | Sundell |
| 2,638,523 | A | 5/1953 | Rubin |
| 2,834,158 | A | 5/1958 | Petermann |
| 2,990,616 | A | 7/1961 | Kuris et al. |
| 3,131,515 | A | 5/1964 | Mason |
| 3,535,955 | A | 10/1970 | Stanley et al. |
| 3,802,040 | A | 4/1974 | Nomamoto |
| 3,814,016 | A | 6/1974 | Leach et al. |

(Continued)

FOREIGN PATENT DOCUMENTS

| | | |
|---|---|---|
| DE | 10123400 | 2/2002 |
| EP | 1139638 | 10/2001 |

(Continued)

OTHER PUBLICATIONS

International Search Report and Written Opinion, PCT/US2012/024332, 12 pages, Jun. 19, 2012.

(Continued)

*Primary Examiner* — John Goff
*Assistant Examiner* — Carson Gross
(74) *Attorney, Agent, or Firm* — Brownstein Hyatt Farber Schreck, LLP

(57) ABSTRACT

A composite enclosure for housing electronic devices, and methods related thereto, are provided. In particular, in some embodiments, a method of manufacturing a composite enclosure for housing electronic devices includes winding composite material about a mandrel and curing the composite material to create a composite hoop. A panel is formed in a separate process that includes stacking a plurality of composite layers in a mold and curing the composite layers to create a composite panel. The composite hoop and the composite panel are bonded together to form the composite enclosure.

16 Claims, 14 Drawing Sheets

(56) References Cited

U.S. PATENT DOCUMENTS

| | | | |
|---|---|---|---|
| 3,957,715 A | 5/1976 | Lirones et al. | |
| 4,343,846 A | 8/1982 | Kohn | |
| 4,353,763 A * | 10/1982 | Simons | 156/184 |
| 4,439,298 A | 3/1984 | Ford et al. | |
| 4,467,168 A | 8/1984 | Morgan et al. | |
| 4,622,091 A | 11/1986 | Letterman | |
| 4,934,103 A | 6/1990 | Campergue et al. | |
| 4,988,550 A | 1/1991 | Keyser et al. | |
| 5,009,821 A | 4/1991 | Weaver | |
| 5,052,153 A | 10/1991 | Wiand | |
| 5,064,707 A | 11/1991 | Weaver et al. | |
| 5,101,599 A | 4/1992 | Takabayasi et al. | |
| 5,111,579 A | 5/1992 | Andersen | |
| 5,116,138 A | 5/1992 | Macsenti et al. | |
| 5,140,773 A | 8/1992 | Miwa et al. | |
| 5,237,788 A | 8/1993 | Sandow | |
| 5,249,534 A | 10/1993 | Sacks | |
| 5,264,992 A | 11/1993 | Hogdahl et al. | |
| 5,395,682 A | 3/1995 | Holland et al. | |
| 5,439,330 A | 8/1995 | Bayer et al. | |
| 5,500,164 A | 3/1996 | Livesay et al. | |
| 5,503,506 A | 4/1996 | Yuan | |
| 5,619,889 A | 4/1997 | Jones et al. | |
| 5,755,539 A | 5/1998 | Takeuchi et al. | |
| 5,865,569 A | 2/1999 | Holstein et al. | |
| 5,879,492 A | 3/1999 | Reis et al. | |
| 5,967,357 A | 10/1999 | Kellogg et al. | |
| 5,984,600 A | 11/1999 | Gierth | |
| 6,117,517 A | 9/2000 | Diaz et al. | |
| 6,179,943 B1 | 1/2001 | Welch et al. | |
| 6,193,089 B1 | 2/2001 | Yu | |
| 6,267,036 B1 | 7/2001 | Lani | |
| 6,276,100 B1 | 8/2001 | Woll et al. | |
| 6,299,246 B1 | 10/2001 | Tomka | |
| 6,435,363 B2 | 8/2002 | Fingerhut et al. | |
| 6,437,238 B1 | 8/2002 | Annerino et al. | |
| 6,689,246 B2 | 2/2004 | Hirahara et al. | |
| 6,703,519 B1 | 3/2004 | Buvat et al. | |
| 6,775,908 B2 | 8/2004 | Ohara et al. | |
| 6,846,221 B2 | 1/2005 | Ulrich et al. | |
| 6,871,527 B2 | 3/2005 | Hansma et al. | |
| 6,973,815 B2 | 12/2005 | Bryans et al. | |
| 7,029,267 B2 | 4/2006 | Caron et al. | |
| 7,063,763 B2 | 6/2006 | Chapman, Jr. | |
| 7,068,343 B2 | 6/2006 | Saitoh | |
| 7,097,371 B2 | 8/2006 | Hasunuma et al. | |
| 7,115,323 B2 | 10/2006 | Westre et al. | |
| 7,191,555 B2 | 3/2007 | Hughes | |
| 7,238,089 B2 | 7/2007 | Tsumuraya et al. | |
| 7,326,012 B2 | 2/2008 | Schlotter | |
| 7,338,235 B2 | 3/2008 | Weghaus et al. | |
| 7,354,350 B2 | 4/2008 | Glimpel et al. | |
| 7,393,577 B2 | 7/2008 | Day et al. | |
| 7,436,653 B2 | 10/2008 | Yang et al. | |
| 7,503,368 B2 | 3/2009 | Chapman et al. | |
| 7,527,321 B1 | 5/2009 | Benderoth et al. | |
| 7,545,628 B2 | 6/2009 | Takuma | |
| 7,560,152 B2 | 7/2009 | Rajabali et al. | |
| 7,571,828 B2 | 8/2009 | Palley et al. | |
| 7,588,970 B2 | 9/2009 | Ohnuma | |
| 7,628,879 B2 | 12/2009 | Ackerman | |
| 7,710,728 B2 | 5/2010 | Arisaka et al. | |
| 7,762,028 B2 | 7/2010 | Valentz et al. | |
| 7,790,637 B2 | 9/2010 | DiFonzo et al. | |
| 7,934,676 B2 | 5/2011 | Dufresne et al. | |
| 7,963,483 B2 | 6/2011 | Roming et al. | |
| 7,971,400 B2 | 7/2011 | Boldt et al. | |
| 7,988,532 B2 | 8/2011 | Choo et al. | |
| 8,031,186 B2 | 10/2011 | Ostergaard | |
| 8,042,770 B2 | 10/2011 | Martin et al. | |
| 8,096,859 B2 | 1/2012 | Schimweg | |
| 8,252,133 B2 | 8/2012 | Feng et al. | |
| 8,419,883 B2 | 4/2013 | Day et al. | |
| 8,691,037 B2 | 4/2014 | Ingram et al. | |
| 2002/0195742 A1 | 12/2002 | Beck et al. | |
| 2003/0078070 A1 | 4/2003 | Hsu | |
| 2005/0097717 A1 | 5/2005 | Rasmussen | |
| 2005/0142369 A1 | 6/2005 | Canady et al. | |
| 2007/0134466 A1 | 6/2007 | Rajaram et al. | |
| 2008/0090477 A1 | 4/2008 | Balthes et al. | |
| 2008/0094372 A1 | 4/2008 | Philipp | |
| 2008/0169380 A1 | 7/2008 | Jackson et al. | |
| 2009/0040703 A1 | 2/2009 | Gotham et al. | |
| 2009/0041984 A1 | 2/2009 | Mayers et al. | |
| 2009/0059502 A1 * | 3/2009 | Filson et al. | 361/681 |
| 2009/0095523 A1 * | 4/2009 | Stevenson et al. | 174/565 |
| 2009/0142157 A1 | 6/2009 | Wang et al. | |
| 2009/0208721 A1 * | 8/2009 | Tsuchiya et al. | 428/220 |
| 2009/0267266 A1 | 10/2009 | Lee et al. | |
| 2010/0078254 A1 | 4/2010 | Rolfe et al. | |
| 2010/0233424 A1 | 9/2010 | Dan-Jumbo et al. | |
| 2010/0289390 A1 | 11/2010 | Kenney | |
| 2011/0050509 A1 | 3/2011 | Ayala Vazquez et al. | |
| 2011/0180557 A1 | 7/2011 | Kenney | |
| 2011/0183580 A1 | 7/2011 | Kenney | |
| 2011/0210476 A1 | 9/2011 | DiFonzo | |
| 2011/0290685 A1 | 12/2011 | Kenney | |
| 2012/0003454 A1 | 1/2012 | Younes | |
| 2012/0021196 A1 | 1/2012 | Kenney | |
| 2012/0147592 A1 | 6/2012 | Takase | |
| 2013/0148288 A1 | 6/2013 | Kenney | |
| 2013/0273295 A1 | 10/2013 | Kenney et al. | |

FOREIGN PATENT DOCUMENTS

| | | |
|---|---|---|
| EP | 2047983 | 4/2009 |
| EP | 2051572 | 4/2009 |
| JP | 2006123475 | 5/2006 |
| JP | 2006185969 | 7/2006 |
| JP | 2007076202 | 3/2007 |
| JP | 2007186228 | 7/2007 |
| JP | 2010115732 | 5/2010 |
| KR | 1020090033440 | 4/2009 |
| WO | WO98/15404 | 4/1998 |
| WO | WO2008/133748 | 11/2008 |
| WO | WO2009/017571 | 5/2009 |

OTHER PUBLICATIONS

Author Unknown, "3M Microspheres Innovative Solutions for Demanding Applications," 3M Innovations, 6 pages, 2004.

* cited by examiner

COMPOSITE ENCLOSURE

BACKGROUND

1. Technical Field

The present application generally relates to composite enclosures and, more particularly, to composite enclosures for mobile devices.

2. Background

A typical mobile phone enclosure consists of a back panel, four side walls, and a glass front panel. Generally, the enclosure may be made of molded plastic, metal or other materials. Composite materials provide a low weight to strength ratio and may be transparent to radio waves and, as such, may provide advantages over other materials. This is especially true when the back wall and side walls are formed as a single assembly to provide the structure with adequate strength and rigidity.

However, it is difficult for composite materials to conform to tight bends that typically provide the contours of enclosures. In particular, a transition from a back wall to a side wall that is approximately normal to the back wall may be particularly difficult. As a rule, the tighter the radius of the transition from the back wall to the sidewalls, the more difficult it is for the composite material to meet the specification without presenting issues. In some designs, no radius is allowed (e.g. the transition occurs at a single point and is 90 degrees). Additionally, overlapping layers that form corners of the sidewalls are difficult to form with an aesthetically pleasing and consistent finish.

SUMMARY

A composite enclosure and methods for manufacturing the same are provided that allows for tight radii at the junction of a back wall and sidewalls. The composite enclosure may be formed by winding composite tape about a mandrel to form sidewalls of the housing. The sidewalls may be a unitary structure having a geometrical shape. For example, in some embodiments, the sidewalls may form a generally rectangular hoop. The surface of the mandrel on which the composite tape is wound may shape the form of the interior of the sidewalls. In some embodiments, a portion of the interior surface may be machined to receive the back wall. The exterior of the sidewalls may be machined to achieve a desired shape and/or finish.

In some embodiments, the mandrel may provide heat during the winding process to facilitate uniform compaction of the prepeg. Generally, it is no intended to cure the material during the winding process. Heat from the mandrel, however, may be used to help cure the composite material that is wound about the mandrel after winding. In other embodiments, heat may be applied to the composite material from a source other than the mandrel. Additionally, pressure may be applied to the composite material during the curing process using silicone contained in an outer mold. In other embodiments, pressure may be applied with an autoclave/Vacuum bag, air bladder, or compression molding.

A flat or substantially flat composite member may serve as the back wall and may be adhered to the sidewalls to form the enclosure. In some embodiments, the back wall may be positioned within a machined region of the interior of the sidewalls. The back wall may be a solid member that, when adhered to the sidewalls, helps increases the strength and rigidity of the enclosure. Adhesive bonding may be used to join the back wall with the sidewalls.

In some embodiments, a method of manufacturing a composite enclosure for housing electronic devices includes forming sidewalls for the composite enclosure comprising. The sidewalls are formed by winding composite material about a mandrel and curing the composite material to create a composite hoop. A panel is formed in a separate process that includes stacking composite layers in a mold and curing the composite layers to create a composite panel. The sidewalls are removed from the mandrel and the panel is removed from the mold. The composite hoop and the composite panel are bonded together to form the composite enclosure.

In other embodiments, a system for manufacturing a composite enclosure is provided that includes a mandrel comprising selectively separable members. At least one of the selectively separable members comprises a recessed platform. A rotatable platform to which the mandrel is selectively coupled is provided that includes a perimeter edge of the rotatable platform comprises gear teeth. The system includes a drive assembly that includes a motor and a worm drive coupled to the motor. The worm drive is configured to engage the gear teeth to rotate the rotatable platform. The system further includes a pressure and guide mechanism that includes a pivoting arm and a compaction roller coupled to the pivoting arm and configured to position composite material onto a surface of the recessed platform of the mandrel. The pressure and guide mechanism includes a pnuematic cylinder coupled to the pivoting arm and configured to cause the compaction roller to apply pressure to composite material wound on the mandrel. In some embodiments, the mandrel may be configured to provide heat during the winding process to facilitate uniform compaction of the prepeg material. Moreover, the mandrel may be used as a primary source of heat to cure composite material after it has been wound onto the mandrel.

While multiple embodiments are disclosed, still other embodiments of the present invention will become apparent to those skilled in the art from the following Detailed Description. As will be realized, the embodiments are capable of modifications in various aspects, all without departing from the spirit and scope of the embodiments. Accordingly, the drawings and detailed description are to be regarded as illustrative in nature and not restrictive.

DETAILED DESCRIPTION

Figure 1:
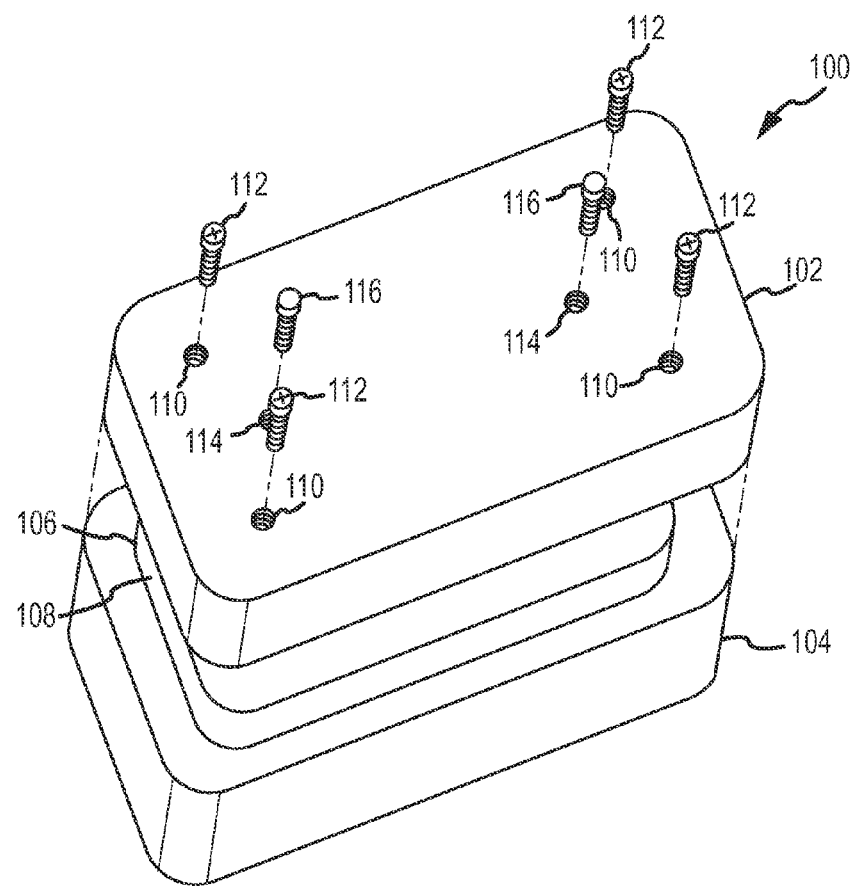
FIG. 1 illustrates a mandrel having two selectively separable members and about which composite material may be wound.

A composite enclosure for housing electronic devices and techniques for manufacturing the same are provided herein. In some embodiments, the composite enclosure may have composite sidewalls and a composite back wall that is generally normal to the sidewalls (e.g. in a plane that is at approximately 90 degrees from the sidewalls). That is, an interior surface where the back wall and the sidewalls are joined is square or a sharp transition (e.g., small radius transition).

The sidewalls and the back wall are initially formed in two separate processes. In particular, the sidewalls may be created by winding composite tape around a mandrel, shaping structure, or other member providing an exterior surface that achieves a desired shape in cured composite material. As such, the side walls may be form as a unitary hoop member having four sides. The sidewalls may be cured by applying heat and pressure to the wound tape. The mandrel may be configured to provide heat to the composite tape. In some embodiments, the composite tape may be heated in an oven or other suitable techniques. Additionally, pressure may be applied to the composite tape using silicone and an outer mold, an autoclave/vacuum bag, an air bladder, compression molding, and so forth. Generally, a recessed surface of the mandrel forms the interior surface of the sidewalls. That is, the shape of the mandrel's outer surface on which the composite tape is wound determines the initial contours of the inner surface of the sidewalls.

The back wall may be formed by stacking composite layers in a mold and curing the stack. As with the sidewalls, heat and pressure may be provided to cure the composite layers. The back wall may form a unitary and generally planar composite member, although in some embodiments the back wall may have a geometric shape other than a plane. The sidewalls and the back wall may be made of the same or different composite materials.

Once the sidewalls and the back wall have been cured, they are removed from the mandrel and mold, respectively. The sidewalls and back wall may be machined after curing to facilitate bonding of the two. In particular, a portion of the inner surface of the sidewalls may be machined to accommodate the back wall and the back wall may be machined to achieve a size and shape accommodated by the sidewalls. In some embodiments, an outer surface of the sidewall is also machined to achieve a desired shape and an even surface.

The back wall is adhered to the sidewalls to form five sides of a composite housing enclosure. It should be appreciated that the composite housing having five sides is provided as an example and other embodiments may have more or fewer sides. For example, a cylindrical composite housing may be provided in an alternative embodiment. After the back wall and sidewalls are joined together, some finishing may be performed to achieve a desired aesthetic effect. For example, the outside perimeter of the sidewalls may be machined. Additionally, the back panel and sidewalls may be ground so that the joint of the sidewalls and back wall is smooth. In some embodiments, the outer surfaces of the sidewalls and back wall may be lapped to further smooth and condition the surface.

Generally, the composite materials used to make the composite enclosure may include a glass reinforced epoxy and/or carbon fiber reinforced epoxy. However other reinforcing fibers may also be used such as aramid, polyethylene, polyproplene, quartz, and ceramic. Additionally, other possible matrix materials such as polyester, vinyl-ester, cyanate, ester, nylon, PEEK (polyether ether ketone), PPS (Poly(phenylene sulfide)), and the like may be used. In some embodiments, high modulus pitch fiber may be used for stiffness. In particular, GRANOC® CN-60 fiber, reinforced sheet impregnated with thermoset resin, manufactured by Nippon Graphite Fiber Corp. may be used. As used herein, "composite material" may refer generally to materials having composite construction including unidirectional carbon/epoxy pre-impregnated fiber weave ("prepeg"), such as epoxy used to make carbon fiber reinforced plastic (CFRP).

Turning to the drawings and referring initially to FIG. 1, an exploded view of a mandrel 100 is illustrated. The mandrel 100 is used to form sidewalls of a composite device housing. The mandrel 100 includes two members 102 and 104 that may be selectively coupled together. A lower member 104 includes a recessed platform 106 that is configured to abut an upper member 102 when the two members are coupled together. The recessed platform 106 of the lower member 104 includes a surface 108 on which composite material is wound. A top member 102 may also have a recessed platform that may have the same dimensions as the platform 106 of the lower member 104. In other embodiments, the recessed platform of the upper member 102 may have different dimensions from the platform 106 of the lower member 104. Because the composite material is applied to the surface 108, an interior surface of the sidewalls takes the form of the surface. Although a generally rectangular mandrel is depicted, alternative embodiments may use a mandrel having more or fewer sides, thereby producing a finished housing with a varying number of sidewalls, shapes, and/or configurations.

Figure 2:
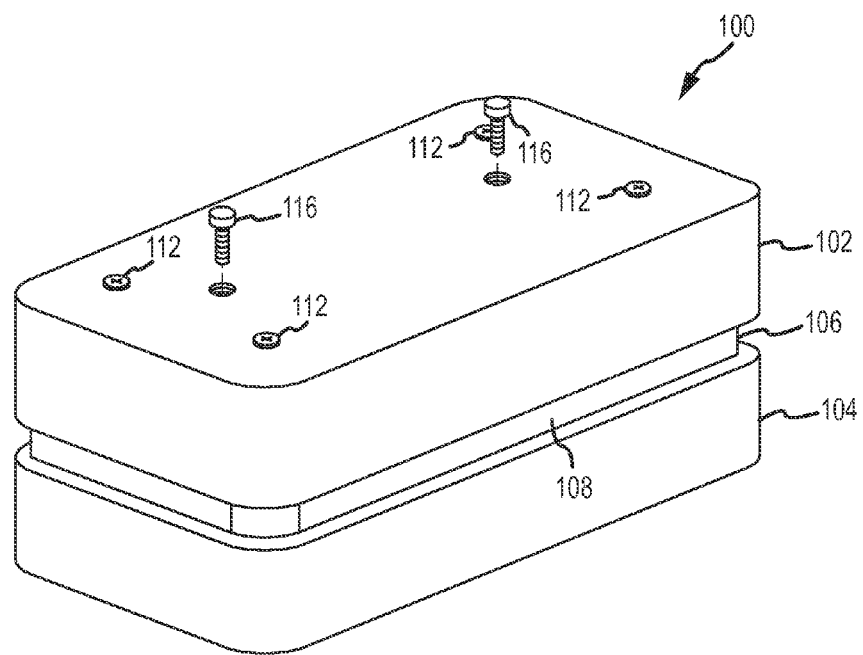
FIG. 2 illustrates the mandrel of FIG. 1 with the two selectively separable members coupled together.

Each of the two members 102 and 104 may include a first set of apertures 110 to receive coupling members 112. The first set of apertures 110 and the coupling members 112 may be configured to selectively couple the upper and lower members 102 and 104 together. The assembled mandrel 100 may be mounted, coupled or otherwise movably fixed to a rotating member of a winding system that will be discussed in greater detail below with reference to FIG. 2. A second set of apertures 114 may also be provided in one or both of the upper and lower members 102 and 104 to allow for coupling members 116 to couple the mandrel 100 to the winding system. In some embodiments the coupling members 112 and 116 may take the form of bolts or screws and may serve to both couple together and align the members 102 and 104 relative to each other. However, it should be appreciated that other coupling mechanisms may be implemented, such as clamping mechanisms or threading built in to the members 102 and/or 104. FIG. 2 illustrates the upper and lower members 102 and 104 coupled together with couplers 112. Additionally, the recessed platform 106 and the surface 108 about which composite material may be wound may be seen in FIG. 2.

Figure 3:
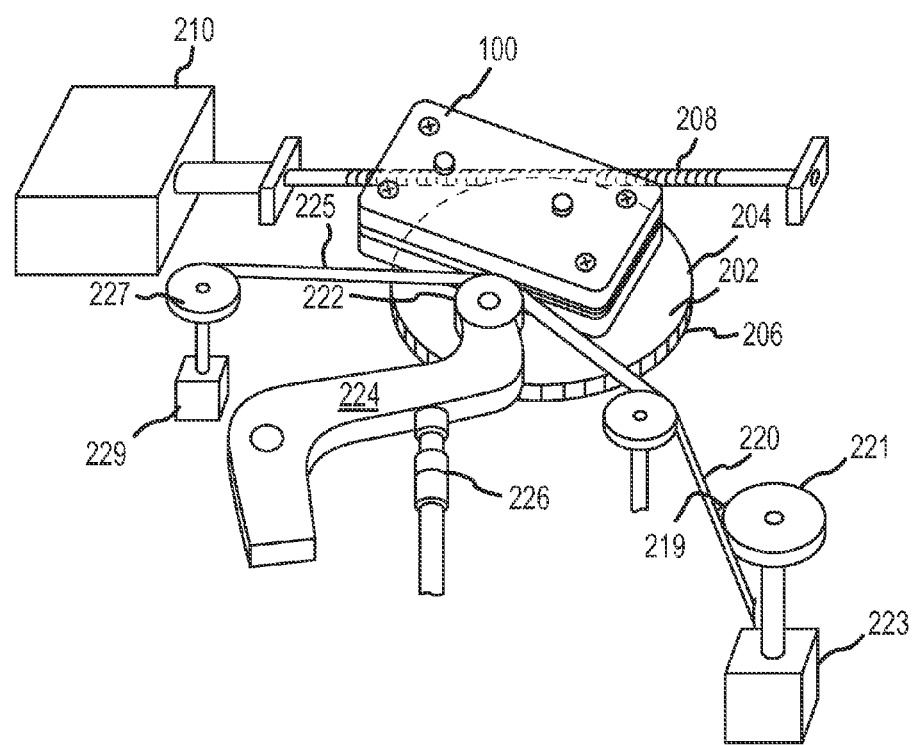
FIG. 3 illustrates a system for winding composite material about the mandrel.

FIG. 3 illustrates a winding system 200 that winds composite material on the mandrel 100. The mandrel 100 is coupled to a rotating platform 202 that may include teeth 204 about its perimeter 206 that engage a worm drive 208. A motor 210 may drive the worm drive 208 to cause the mandrel 100, which is coupled to the platform 202 by couplers 116, to rotate. Composite tape 220, such as unidirectional carbon epoxy pre-impregnated (prepeg) fiber, is applied to the surface of the recessed platform 106 of the lower member 104 as the mandrel rotates. Generally, composite tape 220 (or prepeg) is provided with backing paper 219. The backing paper 219 is removed from the composite tape 220 prior to winding the tape onto the mandrel 100. The backing paper 219 may be removed by a take-up roller 221 which may be driven by a motor 223.

The composite tape 220 may be paced on the mandrel 100 by a compaction roller 222. In some embodiments, the compaction roller 222 may be made of a non/less sticky material such as a thermoplastic material (e.g., Delrin), so that the composite material does not stick to it. In some embodiments, a plastic release film 225 may remain attached to the prepeg as it passes under the compaction roller 222 and then may be separated from the prepeg. In this way, the plastic release film prevents the prepeg from sticking to the compaction roller. A take-up roller 227 may be provided to remove the plastic release film 225. A motor 229 may drive the take-up roller 227.

The compaction roller 222 may be coupled to an end of a rotatable/pivoting arm 224 and may apply pressure to the composite tape 220 as it is wound about the mandrel 100. In particular, in some embodiments, a pneumatic cylinder 226 may be coupled to rotatable arm 224 via linkage 226 to apply compaction pressure so that the composite material is applied at a constant pressure. In another embodiment, a feedback system may be employed to measure compaction pressure and continuously adjust pneumatic, hydraulic, or other means—in order to apply precise and consistent compaction to the composite material. The number of layers of the sidewalls is determined by a desired thickness of the sidewalls. For mobile phones, for example, approximately 30 layers of composite tape may be applied.

The composite material/tape that is used to form the sidewalls may be a thermoset matrix, like epoxy; thermoplastic composites, such as carbon/PEEK; or other suitable composite material. Heat and pressure may be used to cure the composite material. In some embodiments, heat may be provided by the mandrel 100 to aid in compacting the composite material. For example, an electrical current may be provided to a heating element within the mandrel 100 to heat the mandrel. Alternatively, the mandrel 100 may be directly heated by a heat source. Heat may be transferred from the mandrel 100 to the wound composite material to cure the composite material. Moreover, in some embodiments, the heating of the material by the mandrel may affect the tack of the composite material so that the composite material sticks to itself as it is wound. Additionally, the heat provided to by the mandrel during winding may facilitate uniform compaction.

In some embodiments, automated fiber placement machines can be used that cure/consolidate the thermoplastic prepeg as it is wound onto the mandrel 100, by providing heat and pressure so that no additional cure/consolidation is required. In other embodiments, heat and pressure may be applied to the composite material after the mandrel 100 has been decoupled from the winding system 200. For example, the mandrel 100 with composite tape 220 wound about it may be placed in an oven or otherwise heated by another technique.

Pressure may be applied by one or more suitable techniques. For example, a steel outermold containing silicone may be secured to the mandrel so that the silicone applies pressure. Examples of other techniques for applying pressure to cure the composite material include vacuum bag/autoclave, air bladder, or compression molding. In some cases the compaction pressure during winding is adequate to produce a high quality structure and no additional means of applying pressure during cure is required.

Figure 4:
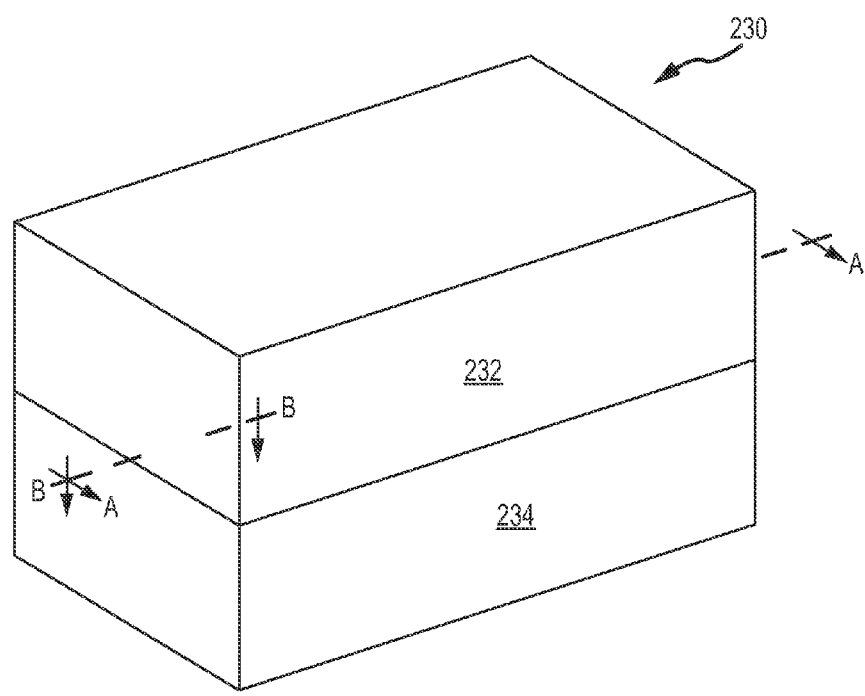
FIG. 4 illustrates an overmold that may be coupled about the mandrel during a curing process.
Figure 5:
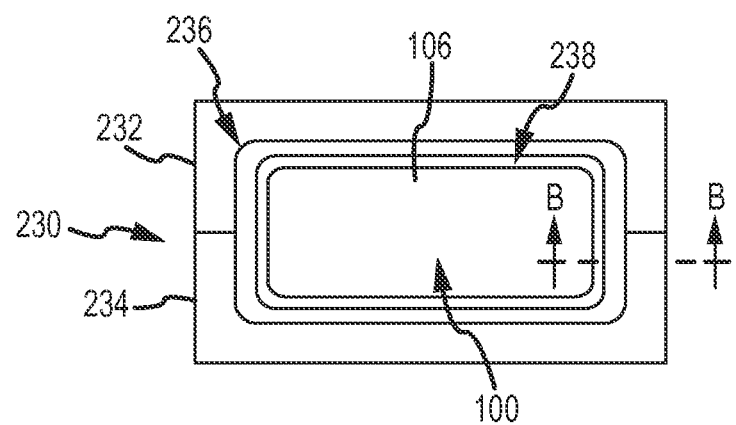
FIG. 5 illustrates a cross-section of the overmold of FIG. 4 with the mandrel taken along line AA.
Figure 6:
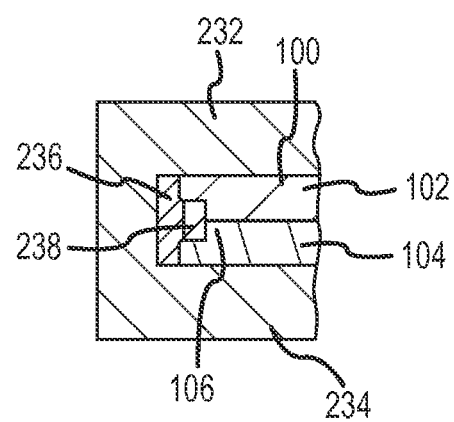
FIG. 6 illustrates a cross-section of the overmold of FIG. 4 with the mandrel taken along line BB.

FIG. 4 illustrates a an overmold 230 having top and bottom portions 232 and 234 holding a silicone sleeve, and the mandrel 100 with wound composite material. The top and bottom portions 232 and 234 may be coupled together in any suitable manner such as screws, clamps, and so forth. FIG. 5 is a cross sectional view of the overmold 230 showing a silicone sleeve 236 surrounding carbon/epoxy layers 238 that are wound about the mandrel 100. FIG. 6 shows another cross sectional view showing the overmold 230 containing the silicone sleeve 236 to apply pressure to the composite material 238.

The back wall may take a generally planar (e.g., flat) shape and can be molded using the same family of materials as the sidewalls. Additionally, composite woven fabrics may be used. For a mobile phone housing, a glass epoxy woven fabric may be used. Generally, compression molding may be used to make the back wall, however, other methods may also be implemented such as bladder molding, vacuum bag/autoclave, resin transfer molding, and so forth. It should be appreciated that the back wall may take any suitable shape and, in some embodiments, may not be planar. In particular, the back wall may have a curvature to give a convex appearance to the housing, or may have another geometric shape. The back wall may be formed by layering composite plies in a mold and applying heat and pressure to cure the plies into a unitary member, or via other known techniques.

Figure 7:
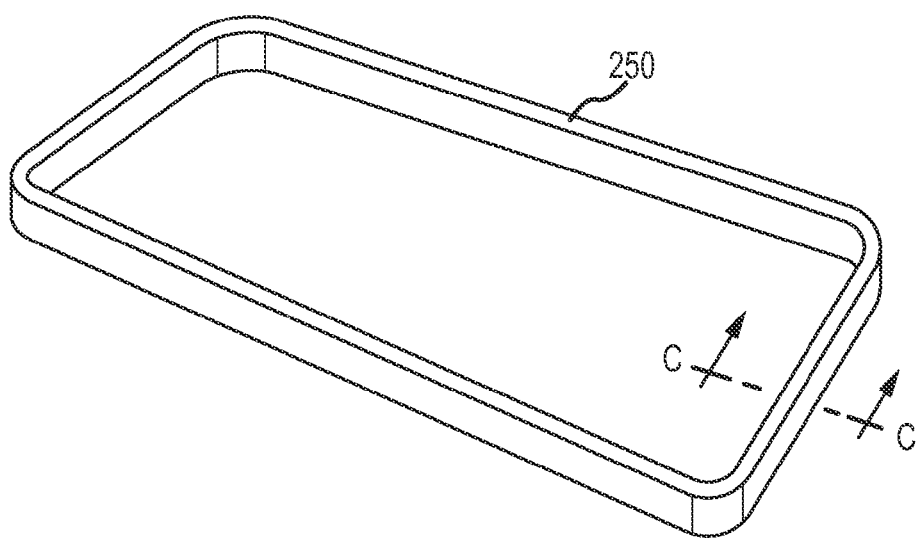
FIG. 7 illustrates a cured composite hoop removed from the mandrel.

Once the back wall and sidewalls are cured, they may be removed from their respective mold(s) and/or from the mandrel 100. FIG. 7 illustrates sidewalls 250 after being removed from the mandrel 100 by separating the upper and lower members 102 and 104 of the mandrel. As may be seen, the sidewalls 250 are provided as a unitary member. The sidewalls 250 may be machined to achieve desired dimensions and characteristics. In particular, the side walls may be machined to form the outside shape of the sidewalls and to provide details for joining the back wall. That is, the sidewalls 250 are machined to provide sufficient area for adhering the back wall thereto.

In some embodiments, 90 degree plies may be added to the sidewalls 250 to improve the structural properties in the 90 degree direction. This can be done in a variety of different ways. For example, the 90 degree plies may be placed manually, or the 90 degree plies may be pre-laminated onto a zero degree strip. Additionally or alternatively, woven material having equal zero and 90 degree properties may be used or a "stitched" prepeg may be used in which unidirectional plies are sewn together. It should be appreciated that one or more techniques may be used to provide the desired structural properties and/or to facilitate quicker and/or easier production.

Figure 8:
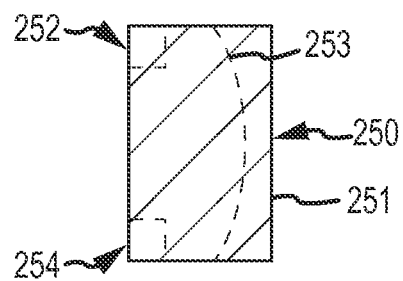
FIG. 8 is a cross section of the cured composite hoop of FIG. 7 showing machining details with an interior of the hoop having a squared surface for bonding with a back panel.
Figure 9:
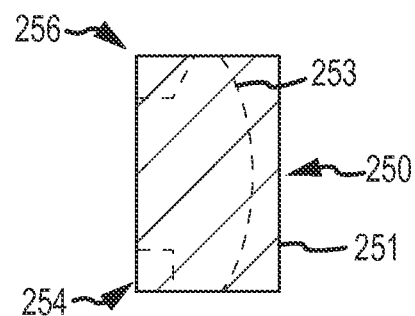
FIG. 9 is a cross section of the cured composite hoop of FIG. 7 showing machining details with an interior of the hoop having a beveled surface for bonding with a back panel.
Figure 10:
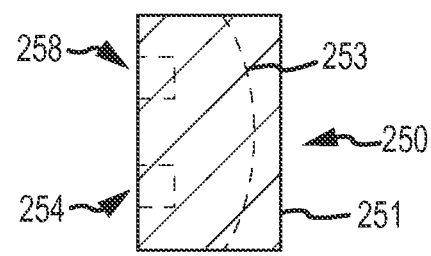
FIG. 10 is a cross section of the cured composite hoop of FIG. 7 showing machining details with an interior of the hoop having a channel for bonding with a back panel.

FIGS. 8, 9 and 10 illustrate cross sectional views of the sidewalls 250 showing shaping that may be performed on the sidewalls. In particular, an outerwall 251 may be machined to achieve a curved and uniform shape 253. In some cases, the thickness of the hoop can become inconsistent, in particular, when a large number of plies are required to build up the desired thickness. The deviation in thickness may produce undesired inconsistency in the cosmetic appearance of the outer wall 251. Hence, in some embodiments, after curing and machining the sidewalls 250 to just under their desired dimensions additional layers may be wound (e.g., 2 or more layers) about the sidewalls 250 and then cured and machined.

In this way, the outer layers are built upon a precise machined layer and will have a precise, consistent appearance after the final machining.

Referring again to the cross sectional view of FIG. 8, portions 252 and 254 may be machined to receive the back wall and a faceplate, respectively. It should be appreciated that the faceplate may take one of many different forms including a glass, plastic, metal, ceramic, and the like. to provide for a display and or input and output for a user. In the interest of brevity, the faceplate will not be discussed further. In the cross-sectional view of FIG. 9, portion 256 is machined with a bevel rather than squared surface for coupling with the back wall. In the cross-sectional view of FIG. 10, a channel 258 is provided in which the back wall may be positioned. It should be appreciated that depending on the shape of the sidewalls 250, the back wall will take a corresponding shape to help facilitate bonding. That is, the back wall may be machined to fit within the sidewalls. One or more machining techniques may be employed, such as computer numerical code (CNC) machining, waterjet cutting, laser machining, and so forth.

Figure 11:
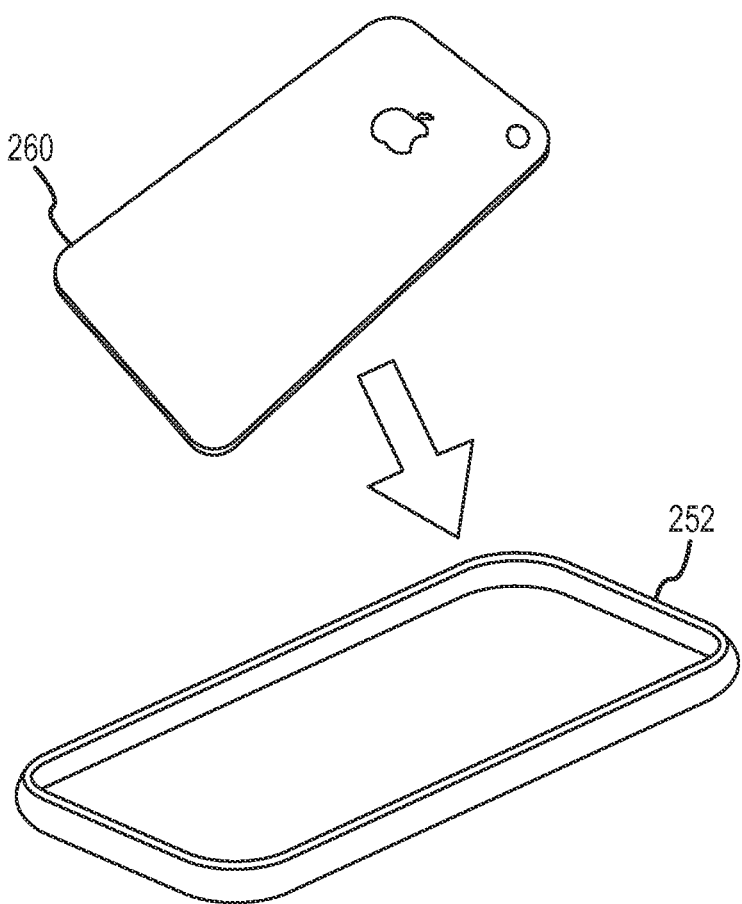
FIG. 11 illustrates the hoop and a back panel ready for bonding to form a composite enclosure.
Figure 12:
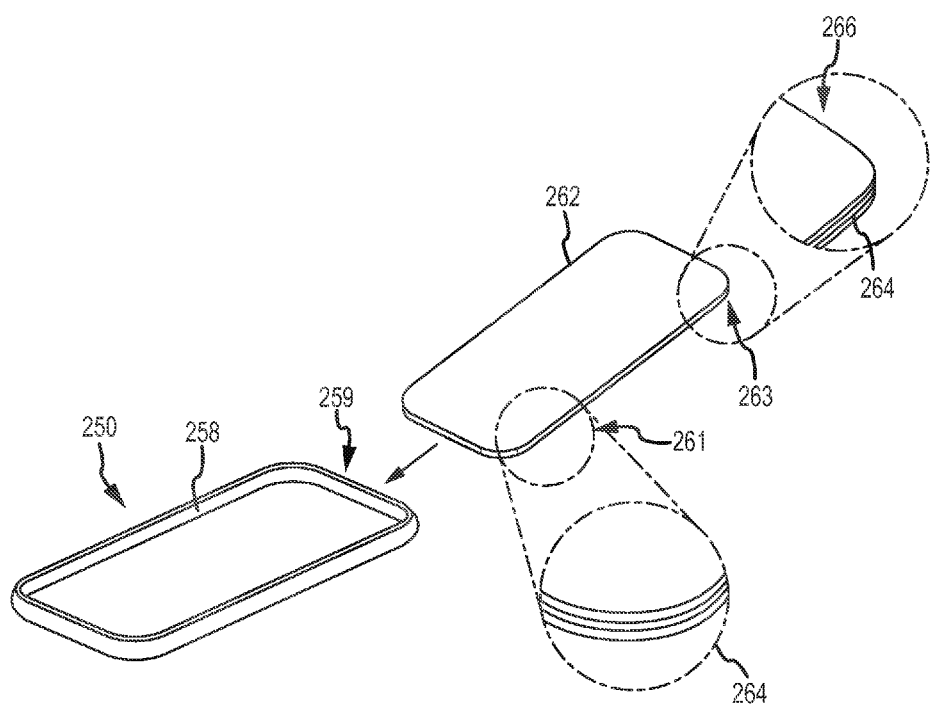
FIG. 12 illustrates the hoop with a channel as in FIG. 10 and a back panel having a lip for bonding the hoop and channel together.

The machined sidewalls and back wall are joined together. FIG. 11 illustrates a machined back wall 260 being joined to the sidewalls 250. In some embodiments, the adhesive for joining the sidewalls and the back is epoxy, although other bonding adhesive may also be used to join the two together. FIG. 12 illustrates the joining of a back wall 262 with the sidewalls 250 where the sidewalls 250 have a channel 258 (e.g., FIG. 10) for receiving the back wall 262. A rear end 259 of the sidewalls 250 is machined away to allow for the back wall to slideably engage the channel 258. As may be seen in a first magnified region 261, the back wall 262 includes a lip protruding outwardly from its side to engage the channel 258 of the side wall. The second magnified region 263 shows the lip 264 blending into a rear end 266 of the back wall 262.

Figure 13:
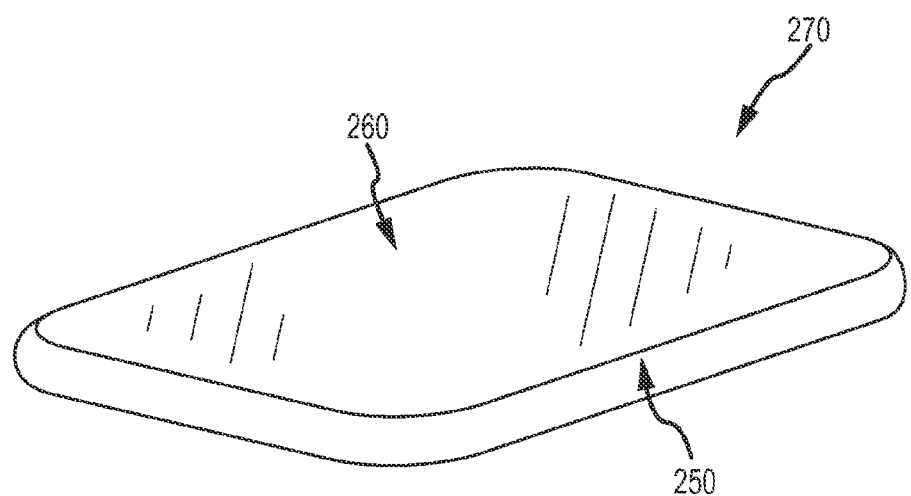
FIG. 13 illustrates an assembled composite enclosure.

FIG. 13 illustrates the joined sidewalls 250 and back wall 260 to form the composite enclosure 270 for housing electronic devices. The composite enclosure may be further machined so as to achieve a desired texture, shape and appearance. As may be appreciated, the composite enclosure may provide a high level of strength relative to its weight. Moreover, a level of transparency (e.g., RF transparency) may be provided for radio and communication frequencies by using radio-transparent materials such as glass/epoxy in at least a portion of the enclosure. In some embodiments, a second of the enclosure may be cut away and replaced with a radio-transparent material, or a hole may be formed during the creation process and then covered or mated with a radio-transparent material. In other embodiments, the entire enclosure may be formed from such a material. As such, antennas may be positioned within the housing without providing apertures therein, in some embodiments. In embodiments where apertures are provide in the enclosure 270 to allow for antenna communications, the composite material generally will not present interference issues, if radio-transparent composite materials are used in these areas.

Figure 14:
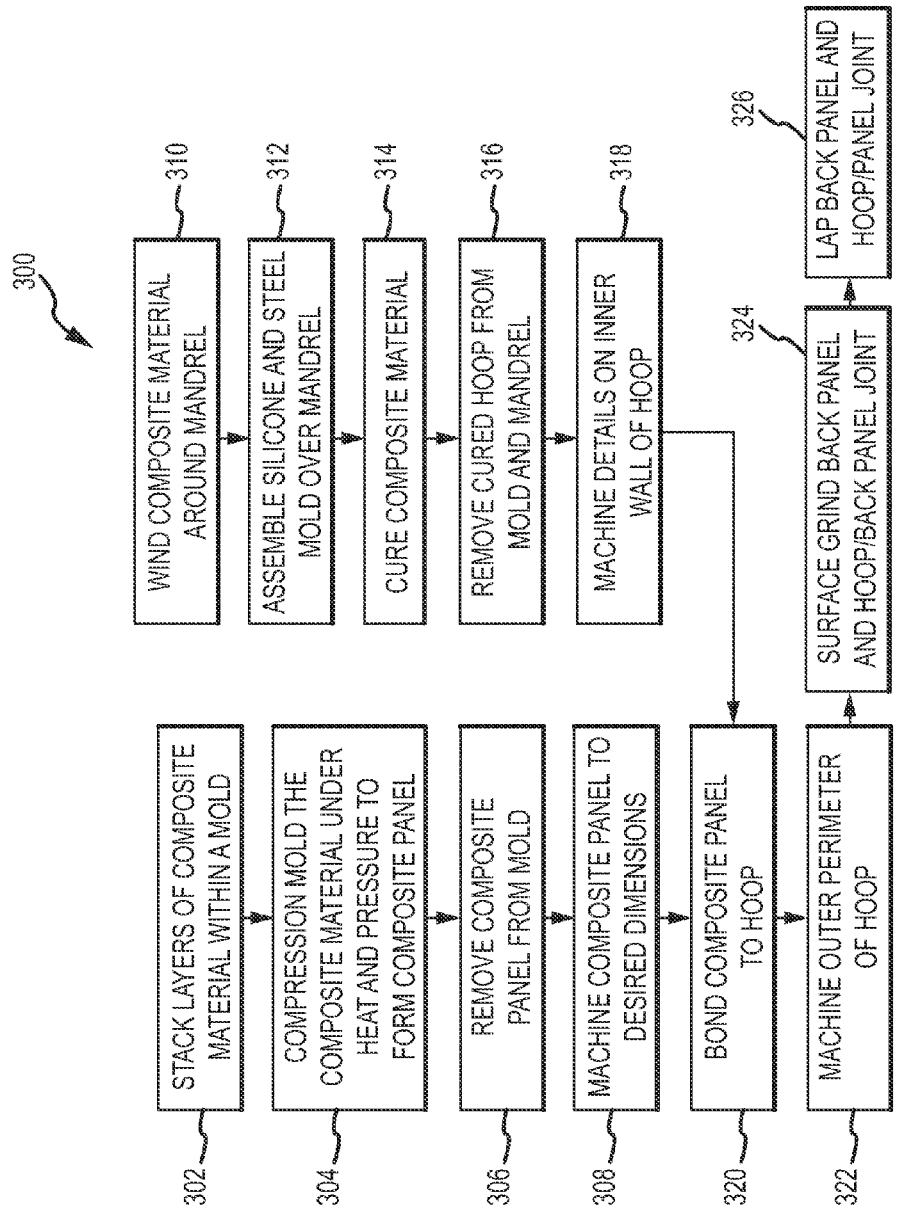
FIG. 14 is a flow chart illustrating a method for manufacturing a composite enclosure for housing an electronic device.

FIG. 14 is a flowchart illustrating a method 300 of manufacturing the composite enclosure 270. As discussed above, the back panel and sidewalls are formed in separate operations. For the back panel, layers of composite material are stacked within a mold (Block 302). In some embodiments, the composite material may be glass/epoxy prepeg or other suitable composite material. The layers are compression molded under heat and pressure (Block 304). After the layers have been cured to form a composite panel, the panel is removed from the mold (Block 306) and machined to desired dimensions (Block 308). Generally, the machining of the panel will include sizing and shaping the edges of the panel to provide for bonding with the sidewalls.

The sidewalls are formed by initially winding composite material about the mandrel 100 (Block 310). In some embodiments, an outer mold 150 holding silicone is provided that encompasses the mandrel 100 provides pressure to the composite material (Block 312). Heat and pressure (applied by the silicone in some embodiments) are applied to cure the composite material wound about the mandrel 100 (Block 314). The cured composite material may generally have a hoop shape and is removed from the mold and mandrel (Block 314). An inside wall of the hoop is machined to facilitate bonding with the composite panel (Block 316).

The composite panel is bonded to the hoop to form the enclosure (Block 318). In some embodiments, epoxy may be used as the bonding agent, although other bonding agents may also or alternatively be utilized. The outside perimeter of the hoop may be machined to achieve a desired shape and/or dimension (Block 320). The back panel and/or back panel/hoop joint may be surface ground (Block 322) and then lapped to achieve a uniform texture and finish (Block 324).

Although the method shown in FIG. 14 discusses particular operations, it should be appreciated that certain operations may be omitted or the operations may be performed in different orders than that shown in FIG. 14.

By separating the manufacture of the enclosure into two subassemblies (e.g., one for the sidewalls and another for the back panel) the product is easier to manufacture and is able to achieve the low radii transitions between the sidewalls and the back panel. Additionally, the panel and sidewalls may be made to a high level of quality and consistency with a desired aesthetic effect. Further, Automation and large volume production are possible for both the panel and the sidewalls in contrast to existing technologies in which the enclosure may be formed as a one piece assembly and for which automation may not be possible.

The foregoing describes example embodiments of a composite enclosure for housing electronic device and methods for making the same. Although the foregoing discussion has presented specific embodiments, persons skilled in the art will recognize that changes may be made in form and detail without departing from the spirit and scope of the embodiments. For example, additional processing steps such as sanding and/or painting may be implemented. Moreover, the mandrel may be made much wider to accommodate winding of multiple sidewalls at once. In some embodiments, a wide composite tape may be wound on the mandrel. In other embodiments multiple separate composite tapes may simultaneously be wound. After winding and curing, the sidewalls may be cut from the cured structure like cutting slices of bread. Accordingly, the specific embodiments described herein should be understood as examples and not limiting the scope thereof.

The invention claimed is:

1. A method of manufacturing a composite enclosure for housing electronic devices comprising:
   winding composite material about a shaping structure;
   curing the composite material to create a composite hoop;
   stacking a plurality of composite layers in a mold;
   curing the plurality of composite layers to create a composite panel;
   machining an inner wall of the composite hoop to form a recess feature for receiving the composite panel;
   engaging the composite panel with the recess feature formed into the composite hoop; and bonding the recess feature of the composite hoop with the composite panel to form a 5-sided composite structure for the composite enclosure.

2. The method of claim 1 wherein the operation of curing the composite material comprises:
assembling an outer mold containing silicone about the shaping structure; and
heating the composite material.

3. The method of claim 1 wherein the operation of curing the composite material comprises:
applying heat from the shaping structure; and
applying pressure to the composite material as it is wound about the shaping structure.

4. The method of claim 3 wherein the operation of applying heat to the composite material is performed by a heated mandrel.

5. The method of claim 3 wherein the operation of winding composite material about the shaping structure is performed by a rotating member coupled to an arm.

6. The method of claim 5 wherein the operation of applying pressure to the composite material is performed by the rotating member.

7. The method of claim 1 further comprising the operation of machining an outside perimeter of the hoop.

8. The method of claim 1 further comprising the operation of surface grinding the composite panel and a joint between the composite panel and the hoop.

9. The method of claim 8 further comprising the operation of lapping the composite panel and the joint between the composite panel and the hoop.

10. The method of claim 1, wherein the recess feature is formed around a perimeter of the inner wall of the composite hoop.

11. The method of claim 10 wherein the operation of machining the inner wall comprises creating a square recess to receive the composite panel.

12. The method of claim 10 wherein the operation of machining the inner wall comprising creating a beveled surface to receive the composite panel.

13. The method of claim 10 wherein the operation of machining the inner wall comprises creating a channel to receive the composite panel.

14. The method of claim 10 further comprising the operation of machining a perimeter edge of the composite panel, the perimeter edge configured to slideably engage with the recess feature formed in the inner wall of the hoop.

15. The method of claim 7, wherein the operation of machining the outside perimeter of the composite hoop comprises forming an arcuate shaped outside perimeter of the composite hoop.

16. The method of claim 1, wherein engaging the composite panel with the composite hoop produces a sharp transition between the composite hoop and the composite panel along the exterior surface of the 5-sided composite enclosure.

* * * * *